United States Patent [19]

Hayakawa

[11] Patent Number: 4,916,708
[45] Date of Patent: Apr. 10, 1990

[54] SEMICONDUCTOR LIGHT-EMITTING DEVICES

[75] Inventor: Toshiro Hayakawa, Tokyo, Japan

[73] Assignee: Eastman Kodak Company, Rochester, N.Y.

[21] Appl. No.: 371,177

[22] Filed: Jun. 26, 1989

[51] Int. Cl.⁴ .............................................. H01S 3/19
[52] U.S. Cl. ........................................ 372/45; 357/4; 357/16; 357/17; 357/90; 371/46
[58] Field of Search ............... 372/45, 43, 46; 357/17, 357/4, 16, 90

[56] References Cited

U.S. PATENT DOCUMENTS

| 4,512,022 | 4/1985 | Tsang | 357/90 |
| 4,573,161 | 2/1986 | Sakai et al. | 372/45 |
| 4,745,612 | 5/1988 | Hayakawa et al. | 372/45 |

FOREIGN PATENT DOCUMENTS

| 0164286 | 7/1986 | Japan | 372/46 |
| 0184895 | 8/1986 | Japan | 372/46 |
| 0055985 | 3/1987 | Japan | 372/43 |

OTHER PUBLICATIONS

W. T. Tsang, Chapter 7, vol. 24, Semiconductors and Semimetals, eds. R. K. Willardson & A. C. Beer, Academic Press, 1987.

Primary Examiner—William L. Sikes
Assistant Examiner—Georgia Y. Epps
Attorney, Agent, or Firm—Raymond L. Owens

[57] ABSTRACT

A semiconductor light-emitting device is provided with optical guide layers that include at least part of compositionally graded layers provided adjacent to the light-emitting layer, and at least one end of the compositionally graded layers is provided with a bridging layer wherein the first derivative of each composition profile with respect to the layer thickness is continuous. This provides an extremely smooth change of composition from one layer to the next, and eliminates problems such as overshoot and undershoot, and can be accomplished using a general control system based on PID.

7 Claims, 4 Drawing Sheets

SEMICONDUCTOR LIGHT-EMITTING DEVICES

BACKGROUND OF THE INVENTION

1. Field of the Invention

The present invention relates to semiconductor light-emitting devices such as semiconductor lasers and light-emitting diodes having a high emission efficiency. It particularly relates to semiconductor light-emitting devices having high-efficiency emission layers which can be readily formed on a substrate of semiconductor mixed crystal using MBE (molecular beam epitaxy) or MOCVD (metal-organic chemical vapor deposition).

2. Description of the Prior Art

In recent years optical communication technology and optical information processing technology have assumed a central role in a wide range of fields. Digital optical communication using optical fibers has made it possible to realize large increases in information carrying capacities, and in the area of optical information processing in which the technology has been extensively utilized in the form of optical disks and laser printers and the like, related fields of application are expanding at a remarkable pace.

In optical technology, light-emitting diodes and semiconductor lasers are the leading light-emitting sources. Laser technology in particular has played an important part in stimulating advances in every area of optical technology in recent years. Also in recent years, gas and solid-state lasers are being supplanted by semiconductor lasers in which the output of the device can be readily controlled precisely by varying the current supply, in addition to which semiconductor lasers are small and long lasting, all qualities which are extremely useful for opening up fields of application that have been beyond the capabilities of gas or solid-state lasers.

Semiconductor light-emitting devices, typical examples of which are light-emitting diodes and semiconductor lasers, are now undergoing new developments on a number of fronts as a result of the introduction of semiconductor mixed crystals in place of the conventional Si crystal semiconductor. In particular, the introduction of AlGaAs semiconductor mixed crystal has led to major advances in semiconductor lasers.

In a semiconductor light-emitting device, the light emission comes from the recombination of minority charged carriers injected into a forward-biased p-n junction in the substrate; that is, the light is produced by direct radiative recombination when a forward current is passed across the p-n junction. Used without further modification to the light, the device functions as a light-emitting diode. However, such a device can be made to serve as a semiconductor laser by using the light to generate a lasing action.

An important subject for realizing semiconductor light-emitting devices having a high light-emitting efficiency concerns how best to fabricate the light-emitting p-n function region on the substrate. Conventionally, the p-n junction light-emitting region is fabricated using epitaxial growth method, such as chemical vapor phase deposition. These conventional processes will now be described with reference to semiconductor lasers.

FIG. 3 illustrates the construction of an ordinary, conventional double heterojunction laser. The laser consists of a cladding layer 12, a light-emitting layer (active layer) 14, a cladding layer 16 and a cap layer 18 formed on a GaAs semiconductor substrate 10. Application of a current to the semiconductor laser by means of electrodes 20 and 22 provided on the substrate side and on the cap layer causes light to be emitted by the injection of electrons or holes into the light-emitting region 14 sandwiched between the cladding layers 12 and 16. The double heterojunction is formed by the light-emitting region 14 sandwiched between the cladding layers 12 and 16.

When utilized as a semiconductor laser, the electrons or holes that constitute the injected carriers are confined by the band gap of the semiconductor device. The effect of confining the injected carriers is that very small current values can produce a high enough gain in the light-emitting region 14 for light amplification and oscillation to take place.

Optical differences in the composition of the light-emitting region 14 compared to the cladding layers 12 and 16 give the light-emitting region 14 a higher refractive index than the cladding layers 12 and 16, and the effect of this is to confine the light in the light-emitting region 14, which enables a powerful amplifying action to be imparted to the light.

With the conventionally structured double heterojunction semiconductor laser it is therefore possible to obtain a high light-emitting efficiency as a result of the above-described injected carrier confinement and light confinement effects, and recent advances in single-crystal growth techniques are bringing further improvements in the light-emitting layer. Specifically, molecular beam epitaxy and metal-organic chemical vapor deposition techniques now enable layers to be formed epitaxially which are 10 Å thick, or even thinner. Thus, such techniques have made it possible to grow light-emitting-layer films of a thinness that was difficult with the previous fabrication technique of liquid phase epitaxy (LPE) and have made it possible to fabricate improved semiconductor light-emitting devices that utilize quantum effects.

A representative application of the quantum effect is the quantum well laser. The light-emitting region in a quantum well laser is illustrated in FIG. 4. As is clear from the enlarged view of FIG. 4, the light-emitting region 14 is constituted of a light-emitter layer 30 and juxtaposed optical guide layers 32 and 34. The light-emitting layer 30 is 100 to 200 Å thick, and with the optical guide layers 32 and 34 forms the active region.

By thus fabricating the light-emitting layer 30 very thin, it becomes a quantum well in which a quantum confinement effect is produced. Whereas in a conventional light-emitting layer the carriers are free to move in three dimensions, in the quantum well the thickness of the light-emitting layer 300 is reduced to such a degree that the movement of the carriers is limited to two dimensions. As indicated by the arrow 100 in FIG. 4, substantially the carriers can only move in a plane that includes the direction in which laser oscillation occurs, and movement in the thickness direction of the layer is suppressed.

The quantum confinement effect therefore enables the light-emitting efficiency to be considerably improved, and as such, has the added advantage of reducing threshold current values and improving the transient overshoot characteristics. There is a detailed description of this type of quantum well laser by W. T. Tsang, Chapter 7, Vol. 24, Semiconductors and Semimetals, eds. R. K. Willardson and Albert C. Beer, Academic Press, 1987.

Still with reference to FIG. 4, the injected carriers are themselves subjected to quantum confinement in the light-emitting layer 30 and give rise to the high-efficiency emission described above. However, because the wavelength of the emitted light exceeds the thickness of the light-emitting layer 30, some of the light escapes from the confines of the light-emitting layer 30. The optical guide layers 32 and 34 are for providing the confinement performance indicated by the emission level characteristic curve 102. Light emitted by the carriers confined in the light-emitted layer 30 is thus almost completely confined within the optical guide layers 32 and 34, as illustrated by the characteristic curve 102, thereby providing semiconductor lasers or light-emitting diodes that have a highly efficient light-emitting action.

The characteristic denoted in FIG. 4 by reference numeral 104 indicates the distribution of the aluminum constituent in the vicinity of the light-emitting region using a semiconductor substrate of GaAs. As is apparent from the light-emitting region 14, at least part of the optical guide layers 32 and 34 has a compositionally graded layer region whereby the composition of the connection between the cladding layers 12 and 16 and the light-emitting layer 30 changes on a continuous basis.

The GaAs system GRIN SCH (graded index separate confinement heterostructure) laser is a known conventional quantum well laser device that includes this type of compositionally graded layers. FIGS. 5 shows an example of the design distribution of the ratio of Al in the light-emitting region of a conventional GaAs mixed crystal semiconductor laser. The distribution is the same as that shown in FIG. 4, except that the view has rotated 90°. In the drawing the horizontal axis represents the thickness direction of the semiconductor mixed crystal and the vertical axis the Al mixed-crystal ratio distribution. In practice, the vertical-axis distribution characteristics closely coincide with the band gaps. Details of the conventional fabrication by MBE of a light-emitting region that includes a compositionally graded layer structure will now be described.

When n-GaAs is used as the semiconductor mixed crystal substrate, a cladding layer 12 of n-Al$_{0.5}$Ga$_{0.5}$As is formed. As is well known, in the case of MBE, a GaAs substrate in a heated state is provided in a vacuum chamber that also contains cells of Al, Ga, and As, and the cells are heated to deposit the substances on the substrate in the required proportions. Regulation of the mixture ratios is effected by controlling the temperature of each cell by a suitable technique such as PID.

The formation of the cladding layer 12 is followed by an optical guide layer 32 that constitutes the compositionally graded layer, a light-emitting layer 30, an optical guide layer 34 and a cladding layer 16; when the device is to be used as a semiconductor laser, a continuous cap layer, not illustrated, is also provided.

After the cladding layer 12 has been formed, the optical guide layer 32 that includes the said compositionally graded layer is formed by closing the Si cell shutter and gradually lowering the temperature of the Al cell as the growth of the compositionally graded layer progresses to thereby crate an undoped GRIN compositionally graded region (CGR). To obtain the light-emitting layer 30 that constitutes the quantum well, the Al cell shutter is closed to grow an undoped GaAs quantum layer. The optical guide layer 34 is grown by closing the shutter of the Al cell and gradually raising the temperature of the Al cell, thereby producing an undoped GRIN region. For the cladding layer 16, the Be cell shutter is then opened to produce a layer of p-Al$_{0.5}$Ga$_{0.5}$As. Thus, using MBE, the required layers can be readily formed by opening and closing the various cells and regulating the temperature of the Al cell.

As described in the above, it is possible to fabricate a conventional light-emitting region on a GaAs substrate, but a problem has been that, in practice, owing to various factors the Al component distribution deviates from the ideal distribution shown in FIG. 4.

The main cause of this error lies in the thermal capacitance of the various metal cells. Even when PID techniques are used to regulate temperature changes, the thermal capacitance produces a delay in the control response, and as shown by the broken line in FIG. 5, at parts 32a and 34a where the growth of the compositionally graded regions starts, this delay produces a deviation from the required characteristics.

At the terminal end of the compositionally graded region, also, a rise in the temperature leads to overshoot while a drop in temperature produces undershoot, so that as shown in the drawing, immediately after the transition from the optical guide layer 34 to the cladding layer 16, owing to Al cell temperature overshoot a deviation 34B, indicated by a broken line, is produced.

Each of these deviations produces noise spikes in the Al component ratio, and the Al component distribution, also the band gap characteristics, deviate away from the ideal characteristics indicated in FIG. 5 by the solid lines, to the characteristics shown by the broken lines.

Deviation might also be expected to arise in the optical guide layer 32 at the terminal end of the compositional grading. In fact, however, when the quantum well light-emitting layer 30 is being fabricated the Al cell shutter is completely closed for the transition to the formation of the quantum well, so there is not overshoot.

Also, to use a different example, if the intention is to follow the GRIN region with a light-emitting layer of Al$_{0.2}$Ga$_{0.8}$As that has a fixed Al component ratio, a dip in the Al component ratio forms at the portion where the layer is started.

From the above, it is therefore clear that if a light-emitting region with a compositionally graded layer structure is formed on a conventional semiconductor light-emitting device with a GaAs substrate, portions where the compositional grading is not smooth give rise to deviations from the expected values. Another problem is that in this semiconductor mixed crystal, composition deviation also produces changes in the lattice constant.

The semiconductor mixed crystal generally used for semiconductor lasers is GaAs, with the requisite band gap being obtained by varying the proportions of Al and Ga relative to the As. As shown in FIG. 5, control is effected so that when the Al component ratio is decreased the band gap value is also reduced. Also, there is a convergence between the lattice constants of the GaAs and the AlAs, the mixture ratios of which are changed, as mentioned above. As a result, where the required compositional grading has been obtained, even if there are fluctuations produced by thermal capacitance-based deviation such as shown by the broken line portions in FIG. 5, because the lattice constant remains virtually the same over the entire range of change in the Al component ratio from GaAs to AlAs, it is relatively difficult to disturb the lattice matching between the substrate and the various layers, or between the layers themselves, so such fluctuation or deviation does not bring about a change in the lattice constant and, in practice, to some extent utilization is possible.

However, because in the case of ordinary mixed crystal semiconductors compositional changes produce changes in the lattice constant, only special mixed crystals such as AlGaAs can be used for semiconductor light-emitting devices.

Needless to say, even with AlGaAs it is desirable that thermal capacitance-based deviation from the required distribution characteristics be eliminated as far as possible.

In ordinary mixed crystal semiconductors, compositional deviation arising between the layers and substrate or among the layers produces strain in the layers which in turn leads to defects caused by lattice mismatching, or in the case of a strained lattice, the strain combines with the current and light-emitting energy, causing rapid degradation of the light-emitting device.

Generally, in order to keep lattice mismatching to 0.1% or less, for example, permissible composition deviation in the layers has to be kept to around 1%, but controlling the composition to within such a small permissible value is difficult. With ordinary semiconductor mixed crystals, it is known that a stable lattice constant can be achieved with respect to compositional changes by maintaining specific component ratios. If lattice matching is considered with reference to $(Al_xGa_{1-x})_{0.5}In_{0.5}P$ and GaAs substrate, for example, if the ratio of $(Al_xGa_{1-x})$ to In is maintained at 1:1, it is possible to obtain a layered structure in which the lattice constant will not be altered by compositional changes. Similarly, in the case of lattice matching of $(Al_xGa_{1x})_{0.48}In_{0.52}As$ with a substrate InP, a fixed lattice constant can be obtained by maintaining a ratio of 0.48:0.52 between the sum of the Al and Ga, and the In.

However, in order to obtain the required grading material characteristics, when growing the light-emitting region the ratio of Al to Ga has to be precisely controlled to $x:1-x$ and the ratio of the sum of Al and Ga to the In the $y:1-y$, which is difficult. When in additional to this precision control requirement there is thermal capacitance-based deviation such as shown in FIG. 5, it becomes impossible to obtain a good composition distribution. Therefore, even if precision control is used to obtain the ideal distribution characteristics indicated by the solid lines in FIG. 5, it is still impossible to prevent some lattice mismatching and defects that lead to degradation of device characteristics and reliability.

The above description of the prior art refers to a conventional GRIN-SCH semiconductor laser fabricated using MBE. However, even when the light-emitting region is formed by another method such as MOCVD or other vapor phase deposition process, when varying the gas flow amount by means of, for example, a mass flow controller during formation of the GRIN region, there is a delay in response before the actual gas flow amount at the substrate equals the set flow amount, because of which it has been impossible to avoid the kind of compositional deviation shown in FIG. 5.

SUMMARY OF THE INVENTION

The object of the present invention is to provide a semiconductor light-emitting device having a light-emitting region that includes a CGR in which lattice mismatching in the CGR and in the region in the vicinity of the CGR is reduced, and the characteristics and the reliability of the device are markedly improved.

In the present invention the above object is attained by a semiconductor light-emitting device provided with optical guide layers that include at least part of compositionally graded layers provided adjacent to a light-emitting layer, wherein at least one end of the compositionally graded layers is provided with a bridging layer wherein the first derivative of each composition profile with respect to the layer thickness is continuous. Stated differently, the bridging layer provides a smooth change of composition profile from an adjacent layer to its graded layer, with none of the sudden changes of prior devices. As a result, even with the existence of the thermal capacitance of the metal cells used in the vapor phase deposition process, the compositional change is smoothly continuous with none of the overshoot, undershoot or dips exhibited in the prior art, which considerably facilitates compositional control based on PID techniques or other such methods.

Therefore, the present invention eliminates instability factors such as metal cell thermal capacitance and enables the compositional distribution to be controlled accurately, and also enables many other types of semiconductor mixed crystals to be used for semiconductor light-emitting devices.

Further features of the invention, its nature and various advantages will be more apparent from the accompanying drawings and the following detailed description of the invention.

DETAILED DESCRIPTION OF THE INVENTION

Figure 1:
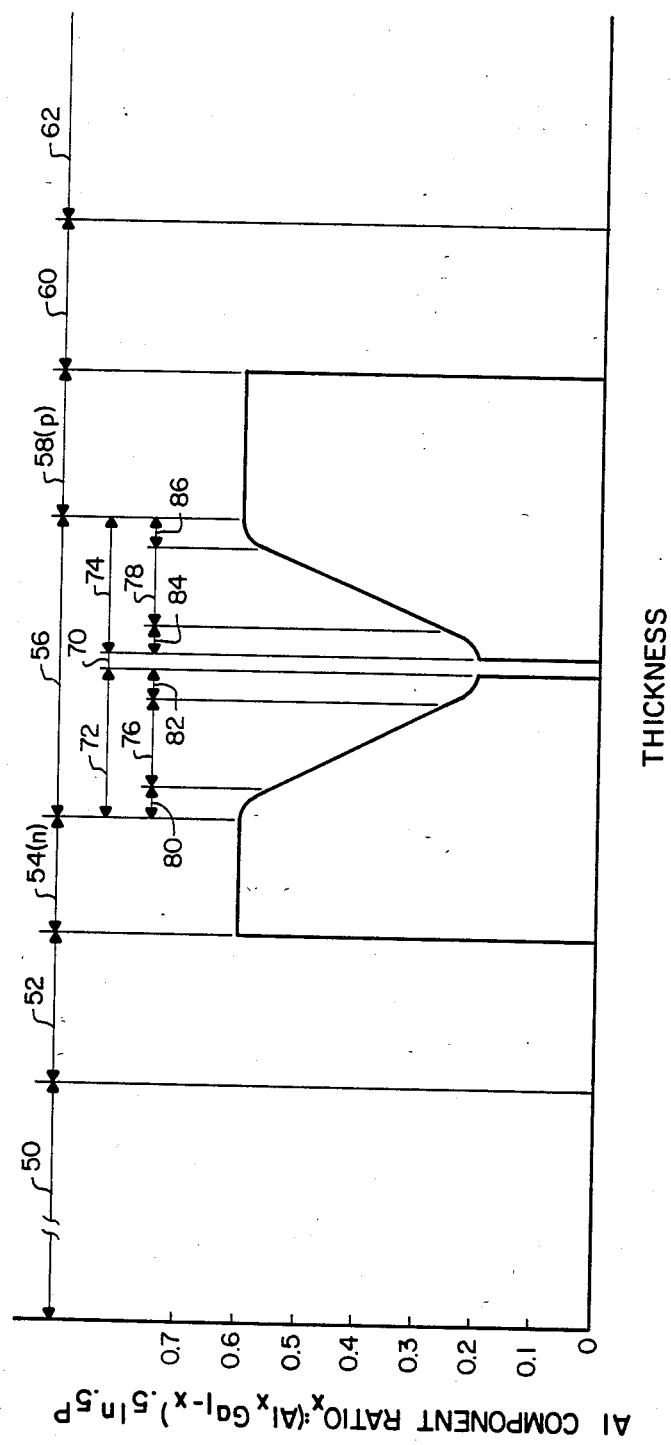
FIG. 1 is an explanatory diagram showing the aluminum distribution and a cross-sectional view of the vicinity of the light-emitting region of an AlGaInP semiconductor laser according to the present invention.

FIG. 1 shows the Al distribution and a cross-sectional view of the vicinity of a light-emitting region of an AlGaInP semiconductor laser according to a first embodiment of the present invention.

FIG. 1, an n—GaAs buffer layer 52 (silicon: $1 \times 10^{18} cm^{-3}$, 0.3 micrometer;) is formed on an n-GaAs substrate 50 (silicon doping: $1 \times 10^{18} cm^{-3}$) using a conventional vapor phase growth method.

An n—$(Al_{0.6}Ga_{0.4})_{0.5}In_{0.5}P$ (silicon: $\times 10^{18} cm^{-3}$, thickness of 1 micrometer) cladding layer 54 is provided on the buffer layer 52, and on the cladding layer 54 is formed a light-emitting region or structure 56 which is described in detail below. A p-$(Al_{0.6}Ga_{0.4})_{0.5}In_{0.5}P$ (beryllium: $5 \times 10^{17} cm^{-3}$, thick of 0.8 micrometer) cladding layer 58 is then formed on the light-emitting region 56, the light-emitting region 56 being thus sandwiched between the cladding layers 54 and 58 to form the same type of double heterojunction as that of a conventional device.

Vapor phase deposition is then used to form a p-Ga$_{0.5}$In$_{0.5}$P layer 60 (beryllium: $1\times10^{18}$cm$^{-3}$, thickness of 0.1 micrometer) followed by a p-GaAs cap layer 62 (beryllium: $5\times10^{18}$cm$^{-3}$, thickness of 0.1 micrometer) on the p-cladding layer 58.

As in the conventional arrangement, the central part of the light-emitting region 56 includes a light-emitting layer (active layer) 70 constituted of an undoped Ga$_{0.5}$In$_{0.5}$P quantum well layer (150 Å thick) sandwiched between undoped (Al$_x$Ga$_{1-x}$)$_{0.5}$In$_{0.5}$P GRIN optical guide layers 72 and 74, each 0.2 micrometer thick, also as in the conventional arrangement and wherein x varies from 0.6 to 0.2. The optical guide layers 72 and 74 each include compositionally graded layers, which in this embodiment are denoted by reference numerals 76 and 78.

A characterizing feature of the present invention is that at least one end of the optical guide layer 72 or 74 or of the compositionally graded layer 76 or 78 adjacent to the light-emitting layer 70 is provided with a bridging layer wherein the first derivative of the composition profile with respect to the thickness thereof is continuous. In this embodiment bridging layers are provided at both ends of the compositionally graded layer 76 and 78 and are denoted by reference numerals 80 and 82, in the case of the compositionally graded layer 76, and 84 and 86 in the case of the compositionally graded layer 78.

The bridging layers 80, 82, 84, and 86 enable deviation in composition produced by the conventional abrupt compositional changes to be securely eliminated.

Details of the vapor phase deposition process used to create the light-emitting region will now be described. After the cladding layer 54 has been grown, the shutter of the Si cell in the vacuum vessel of the vapor phase deposition apparatus is closed, and PID control is used to reduce the temperature of the Al cell while at the same time raising the temperature of the Ga cell. This enables the compositional ratio between Al and Ga to be changed while maintaining the combined ratio of the Al and Ga relative to the indium at a constant level, for forming the optical guide layer 72.

By thus maintaining the composition ratios as described, it is possible thus to maintain a fixed lattice constant within the optical guide layer 72 that enables lattice matching with the GaAs substrate to be accomplished.

As described above, in accordance with this invention, there is a bridging layer 80 at the end of which growth of the optical guide layer 72 is started, and a continuous rate of change in the compositional ratio of Al at this bridging layer 80 is applied, that is, the rate of change starting from a first derivative of zero until a constant value in the compositionally graded layer 76 is reached, which means the first derivative. This makes it possible to readily achieve a cell temperature that conforms to the initially determined characteristics, using for example ordinary PID control. As explained with reference to the conventional structure shown in FIG. 5, it becomes possible to obtain changes in compositional ratio that conform with the design values with no compositional deviation at the beginning of the compositionally graded portions.

In this embodiment the compositionally graded layer 76 is given a constant ratio of change, an attribute that is readily realized merely by effecting a linear adjustment of the aluminum through the use of PID control. In addition, the terminal end of the compositionally graded layer 76 is also provided with a bridging layer (layer 82), so in accordance with the same principle in effect in the case of the bridging layer 80 at the initial end, the potential inversion resulting from the compositional change characteristics is imparted to the bridging layer 82, so that the ratio of compositional change gradually reverts to zero and abrupt jumps in the ratio of change at the terminal end are eliminated.

In the same way, the compositionally graded layer 78 on the p side is provided with the bridging layers 84 and 86 wherein the first derivative of the composition profile with respect to the thickness at each end of the compositionally graded layer 78 is continuous, preventing the type of deviation that occurs with the conventional arrangement. Specifically, it is possible to prevent the type of aluminum cell temperature overshoot and gallium cell temperature undershoot that are produced with the conventional arrangement where there is an abrupt compositional change.

Figure 5:
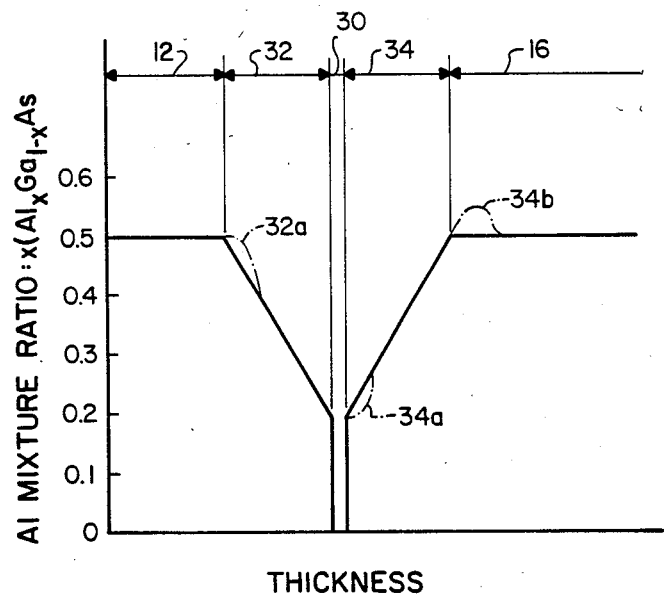
FIG. 5 is an explanatory drawing showing the composition and compositional deviation in the conventional quantum well light-emitting layer shown in FIG. 4.
Figure 4:
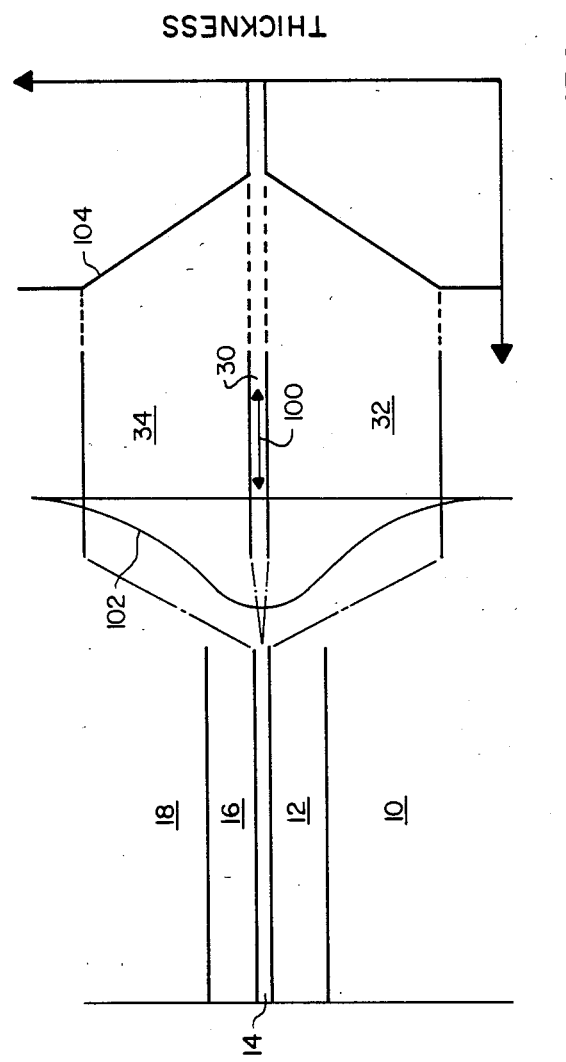
FIG. 4 is an explanatory drawing of the layer structure of a semiconductor laser in which the light-emitting region is a quantum well.

Similarly to the conventional arrangement, in this embodiment the light-emitting layer 70 is formed as a Ga$_{0.5}$In$_{0.5}$P quantum well light-emitting layer, following the formation of the optical guide layer 72, by closing the shutters of the aluminum and gallium cells and opening the shutter of another gallium cell that is provided separately, making it difficult for the type of compositional deviation to occur at the locations shown in FIG. 5. In practice this also makes it possible to omit the bridging layer 82 provided at the terminal end of the compositionally graded layer 76. However, with respect to the optical guide layer 74 on the other side of the light-emitting layer 70, because the bridging layer 84 is an essential requirement at the initial end of the compositionally graded layer 78 it is preferable to provide the bridging layer 82 to achieve symmetry between the optical guide layers 72 and 74 with respect to the light-emitting layer 70.

Moreover, it is necessary to set a prescribed time to allow fluctuation to stop in the aluminum and gallium cells used to grow the optical guide layer 72 prior to forming the light-emitting layer 70, and if there is no bridging layer 82, when the light-emitting layer 70 is very thin and the growth time very short the set time may not be enough to eliminate the said fluctuation in the aluminum and gallium cells before the completion of the optical guide layer 74. In order also to eliminate such instability factors and to achieve very thin quantum well layers, it is therefore preferable that the bridging layer 82 be provided.

Thus, in accordance with this embodiment the light-emitting layer 70 is sandwiched between the optical guide layers 72 and 74, and by providing bridging layers 80, 82, 84, and 86 at both ends of the compositionally graded layers 76 and 78, a stable light-emitting region is provided that is free of compositional deviation.

Although the drawing does not show details, to complete the semiconductor laser, plasma CVD is used to form a layer of SiN$_x$ about 0.3 micrometer thick on the p-GaAs layer, and a photolithographic process is then used to remove the SiN$_x$ layer in strips 10 micrometers wide. On the p side, an ohmic electrode is then formed by the alloying deposition of AuZn/Au on the p-GaAs layer 62. On n-side electrode of AuGe/Ni/Au is formed on the reverse side of the GaAs substrate.

The laser emitting ends of the semiconductor thus fabricated are cleaved to form a resonator and the wafer is then scribed to divide it into individual chips and thereby provide the completed semiconductor laser device.

In the embodiment described above, a semiconductor laser is used as a semiconductor light-emitting device according to the present invention. The bridging layer of this invention is also highly effective as a carrier injection layer with respect to light-emitting diodes, when the emission region is formed on the substrate as a light-emitting layer between compositionally graded layers.

Figure 2:
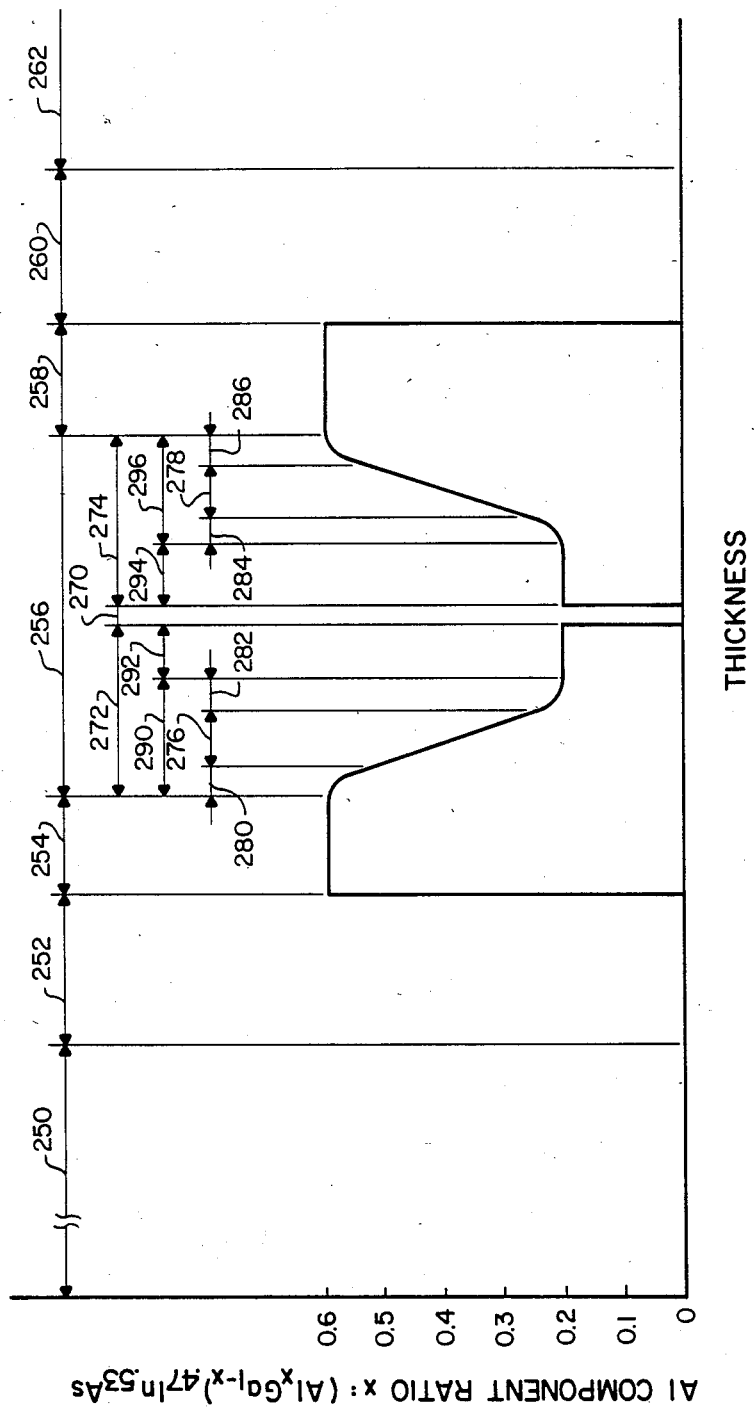
FIG. 2 is an explanatory diagram of a second embodiment of a semiconductor laser according to the present invention, showing the aluminum distribution in the vicinity of an AlGaInAs mixed crystal light-emitting region.
Figure 3:
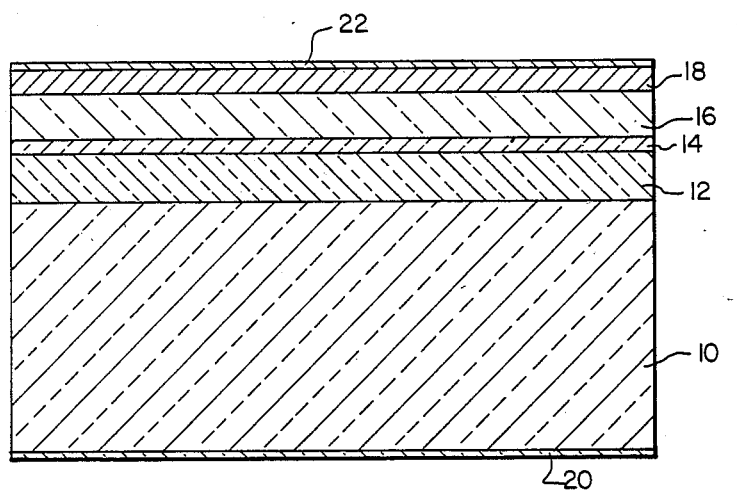
FIG. 3 is an explanatory drawing of the layer structure of a conventional double heterojunction semiconductor laser.

FIG. 2 shows a second embodiment according to the present invention. As in the case of the first embodiment, it shows the Al distribution and a cross-sectional view of the vicinity of a lightemitting region of an AlGaInAs semiconductor laser. In this second embodiment, the substrate 250 is constituted on n-InP(S: $1\times10^{18}$cm$^{-3}$). An n-Ga$_{0.47}$In$_{0.53}$As buffer layer 252 (S: $1\times10^{18}$cm$^{-3}$, thickness of 0.5 micrometer) is formed on the substrate 250, then an n-(Al$_{0.6}$Ga$_{0.4}$)$_{0.47}$In$_{0.53}$As cladding layer 254 (S: $1\times10^{18}$cm$^{-3}$, thickness of 1.5 micrometers).

A light-emitting structure 256 is then formed on the cladding layer 254, followed by a p-(Al$_{0.6}$Ga$_{0.4}$)$_{0.47}$In$_{0.53}$As cladding layer 258 (Zn: $1\times10^{18}$cm$^{-3}$, thickness of 1.5 micrometers). A continuous p-Ga$_{0.47}$In$_{0.53}$As cap layer 260 (Zn: $4\times10^{18}$cm$^{-3}$, thickness of 0.3 micrometer) is then grown on the cladding layer 258 using MOCVD.

As in the first embodiment, there is a light-emitting structure or region 256 that includes a light-emitting layer 270 sandwiched between optical guide layers 272 and 274. The light-emitting layer 270 is constituted as an undoped Ga$_{0.47}$In$_{0.53}$As quantum well layer that is 150 Å thick. The optical guide layer 272 includes an undoped (Al$_x$Ga$_{1-x}$)$_{0.47}$In$_{0.53}$As GRIN layer 290 that is 0.2 micrometer thick and an undoped (Al$_{0.2}$Ga$_{0.8}$)$_{0.47}$In$_{0.53}$As layer 292 that is 0.1 micrometer thick. Similarly, the optical guide layer 274 consists of an undoped (Al$_{0.2}$Ga$_{0.8}$)$_{0.47}$In$_{0.53}$As layer 294 that is 0.1 micrometer thick and undoped (Al$_x$Ga$_{1-x}$)$_{0.47}$In$_{0.53}$As GRIN layer 296 that is 0.2 micrometer thick. As shown x can vary from 0.6 to 0.2.

Thus, in the second embodiment, just part of the optical guide layers 272 and 274 has a GRIN layer 290 and 296, respectively. The ratio of the compositionally graded layer in the optical guide layer and the grading itself may be selected according to requirements.

With reference to FIG. 2, the characteristic feature of this embodiment is that the GRIN layers 290 and 296 actually include the respective compositionally graded layers 276 and 278, at each end of which are formed respective bridging layers 280 and 282, and 284 and 286. As a result, these bridging layers are provided with characteristics whereby the first derivative of each composition profile with respect to the layer thickness is continuous, for a compositional distribution whereby in the GRIN layers 290 and 296 the compositional change at the initial and terminal ends is gradual, starting from zero, with no jumps in the ratio of change.

As has been described, with MOCVD and other such vapor phase fabrication methods, the gas flows are accompanied by various delays, and with an ordinary, simple GRIN region, when there are jumps in the ratio of compositional change it is difficult to effect the various gas flow amounts so that they conform with the prescribed settings.

However, in accordance with this embodiment, by providing bridging layers 280 and 282, 284 and 286 at both ends of the compositionally graded layers 276 and 278, a continuous ratio of change for a compositional change that conforms with the design values can be readily achieved using ordinary PID or other such control methods.

In the embodiment described above, the component ratios of the constituent elements other than the elements accompanying the compositional change are always fixed, but in practice there may be cases where it is desirable to change the element ratio of these fixed components. In the case of AlGaInAs, for example, because in strict terms the components for lattice matching with the InP are Ga$_{0.47}$In$_{0.53}$As and Al$_{0.48}$In$_{0.52}$As, it is better for the ratio of indium in the AlGaInAs to be reduced as the ratio of aluminum to gallium increases. In such a case, for example, the growth rate of the AlGaAs in the AlGaInAs can be maintained constant while varying the ratio of the Al and Ga and slightly reducing the InAs growth rate as the Al is increased, maintaining a fixed lattice constant.

Although the above embodiments have been described with reference to semiconductor lasers, the same or similar layered structures can be used to fabricate high-efficiency light-emitting diodes.

Again, while the above semiconductor mixed crystals were described with reference to AlGaInP and AlGaInAs, for purpose of achieving the object of the invention the mixed crystals could also be Ga$_x$In$_{1-x}$P$_y$As$_{1-y}$ or Al$_x$Ga$_{1-x}$As$_y$Sb$_{1-y}$. In these mixed crystals, a fixed lattice constant may be maintained by interrelated changes between the component ratios denoted by x and y, so that no strain caused by differences in lattice constants produced between the substrate and the formed layers, or between layers.

For the purposes of the present invention, any of the following preferred examples; of semiconductor mixed crystals may be used:

(Al$_x$Ga$_{1-x}$)$_y$In$_{1-y}$P; (Al$_x$Ga$_{1-x}$)$_y$In$_{1-y}$As;

Ga$_x$In$_{1-x}$P$_y$As$_{1-y}$; Al$_x$Ga$_{1-x}$As$_y$Sb$_{1-y}$ ($0 \leq x \leq 1$, $0 \leq y \leq 1$).

Also, while in the embodiments described above MBE and MOCVD were used to form the semiconducting layers on the substrate, the present invention is not limited to these methods. Other methods such as chemical beam epitaxy or gas source molecular beam epitaxy may be used or, depending on the characteristics of the semiconductor concerned, vapor phase epitaxy.

For the light-emitting layer according to the present invention, a multi-quantum well structure may also be utilized consisting of an array of multiple thin-layer quantum wells arranged in the light-emitting region, or an ordinary, relatively thick light-emitting layer.

As has been described, in accordance with the present invention, in a semiconductor light-emitting device in which compositionally graded layers are provided adjacent to the light-emitting layer, semiconducting layers can be grown free of strain by controlling changes in the lattice constant at the ends of the compositionally graded layers and lattice deficiency or strain accompanying changes in the lattice constant can be considerably suppressed, thereby enhancing the characteristics of the device and producing a marked improvement in device reliability.

Thus, the present invention can enhance the characteristics of a device based on AlGaAs, the conventional semiconductor material general used, and it can also be used to realize devices using mixed-crystal semiconductors such as AlGaInP, AlGaInAs, and GaInAsP that provide a high level of performance on a par with AlGaAs devices.

The invention has been described in detail with particular reference to preferred embodiments thereof, but it will be understood that variations and modifications can be effected within the spirit and scope of the invention.

What is claimed is:

1. In a semiconductor light-emitting device including a substrate of semiconductor mixed crystal on which is provided a light-emitting structure that includes a light-emitting layer sandwiched between optical guide layers, each of which includes a compositionally graded layer the improvement comprising:

at least one end of each compositionally graded layer being provided with a bridging layer wherein a first derivative of the composition profile with respect to the layer thickness is continuous, so that the bridging layer provides a smooth change of composition profile to an adjacent layer.

2. The semiconductor light-emitting device of claim 1 wherein the compositionally graded layer is $(Al_xGa_{1-x})_{0.5}In_{0.5}P$.

3. The semiconductor light-emitting device of claim 2 wherein x varies from 0.6 to 0.2 and the light-emitting layer is $Ga_{0.5}In_{0.5}P$.

4. The semiconductor light-emitting device of claim 1 wherein the compositionally graded layer is $(Al_xGa_{1-x})_{0.47}In_{0.53}As$.

5. The semiconductor light-emitting device of claim 4 wherein x varies from 0.6 to 0.2, and the light-emitting layer is $Ga_{0.47}In_{0.53}As$ and further includes two layers of $(Al_{0.2}Ga_{0.8})_{0.47}In_{0.53}As$ each of which connects the light-emitting layer to a compositionally graded layer.

6. The semiconductor light-emitting device of claim 2 wherein a bridging is provided on each end of each compositionally graded layer.

7. The semiconductor light-emitting device of claim 4 wherein the compositionally graded layer is $(Al_xGa_{1-x})_{0.47}In_{0.53}As$.

* * * * *